United States Patent [19]

Mogi et al.

[11] 4,224,633
[45] Sep. 23, 1980

[54] IGFET STRUCTURE WITH AN EXTENDED GATE ELECTRODE END

[75] Inventors: Jun-ichi Mogi, Kawasaki; Kiyoshi Miyasaka; Seiji Enomoto, both of Yokohama, all of Japan

[73] Assignee: Fujitsu Limited, Kawasaki, Japan

[21] Appl. No.: 908,835

[22] Filed: May 23, 1978

[51] Int. Cl.² .......................................... H01L 29/78
[52] U.S. Cl. .................................... 357/23; 357/41; 357/68
[58] Field of Search .......................... 357/23, 41, 68

[56] References Cited

U.S. PATENT DOCUMENTS 3,694,673  9/1972  Au .............................. 307/304

Primary Examiner—Martin H. Edlow
Attorney, Agent, or Firm—Staas & Halsey

[57] ABSTRACT

Self-aligned IGFET structure having a source region, a drain region and a gate electrode placed between the source and drain regions to define a channel region. The gate electrode is provided with an extended end portion on a relatively thick field oxide layer and having a length no less than a predetermined channel length on one side of the channel region so that the breakdown voltage is not decreased on that one side of the channel region.

8 Claims, 7 Drawing Figures

IGFET STRUCTURE WITH AN EXTENDED GATE ELECTRODE END

CROSS-REFERENCES TO RELATED APPLICATIONS

This application corresponds to Japanese Application Number 51-70509 for a utility model, filed on May 31, 1976 by co-assignee. Said Japanese Application was laid open for public inspection on Dec. 7, 1977.

BACKGROUND OF THE INVENTION

1. Field of the Invention

This invention relates to an insulated gate field effect transistor of the self-aligned type, (otherwise called a self-aligned IGFET), especially to a self-aligned IGFET with an extended gate electrode end.

2. Description of the Prior Art

Self-aligned IGFETS have been manufactured using silicon gate technology which can provide high production yields and high density when incorporated in integrated circuits. According to this silicon gate technology, the surface of a semiconductor substrate is exposed at its active region including a source region, a drain region and a channel region. A new gate insulator is formed on the active region by thermal oxidation. A silicon gate electrode is then formed on an area including the channel region. Then, the new gate insulator is etched away only at the source and drain regions, while leaving it under the silicon gate electrode. The next process is to diffuse an impurity into the exposed areas of the substrate to form the source and drain regions using the silicon gate electrode as a diffusion mask. It is therefore not necessary to align the gate electrode with the source and drain regions. Thus, the gate electrode is automatically aligned. Accordingly, the silicon gate technology is often referred to as being of the self-aligned type.

Referring to FIG. 1, a plan view is shown of the structure of an IGFET as incorporated in an integrated circuit. The source region 5 is opposite to the drain region 6 at the channel region 7. The extended regions 5a and 6a of the source and drain regions 5 and 6 are included to provide conductive paths. The gate electrode 4 is extended in another direction for the wiring interconnective and in the same direction as that of source and drain regions 5a and 6a by "d" on the field oxide layer 2. The distance "d" is for ensuring a predetermined channel width in spite of mechanical alignment error. The distance "a" is for the same purpose. Therefore, the distance "c" between the extended regions 5a and 6a is controlled by the gate width "b" and the error "2a".

FIG. 2, is a partial cross section of the IGFET shown in FIG. 1 at the line I—I.

In FIG. 2, the substrate 1 is typically comprised of silicon. The thickness of the field oxide layer 2 is typically about 1 micron meter. The gate insulator 3 is typically comprised of silicon dioxide and is about 1000 angstroms thick. An insulating layer 2 covering the surface of the substrate 1 is not shown in FIG. 1 for the sake of simplicity.

U.S. Pat. No. 3,699,646 discloses a method for simultaneously completing the formation of a contact, a wiring interconnection, a gate and a source or drain.

The method disclosed in the above patent is used in conjunction with the process of manufacturing the IGFET transistor circuit configuration of the present invention.

SUMMARY OF THE INVENTION

According to the present invention, a gate electrode is aligned between a source region and a drain region and is arranged to be parallel to the source and drain regions. The width of the gate electrode is selected to be equal to the spacing between the source and drain regions to enable the fabrication of a small sized IGFET. A well known silicon gate technology is used to manufacture the IGFET of the present invention.

Another feature of the present invention is that the gate electrode is provided with an extended gate electrode end portion. This end portion is not used to provide an electrical connection to the gate electrode. The extended gate electrode end portion has a particular length which is selected so that the length of a diagonal line originating from the cross point of the gate electrode and source region to the cross point of the gate electrode and drain region is not less than the width of the gate electrode. The selection of the length of the end portion insures that the channel length at its side is not decreased and the breakdown voltage of the IGFET is not reduced.

Therefore, an object of the present invention is to provide a small sized IGFET with an extended gate electrode end portion.

Another object of the present invention is to provide a small sized IGFET for use in an integrated circuit, wherein its breakdown voltage is not reduced.

Other features and objects of the present invention will be apparent from the following description with regard to the preferred embodiment shown in the drawings.

DESCRIPTION OF THE PREFERRED EMBODIMENTS

Figure 3:
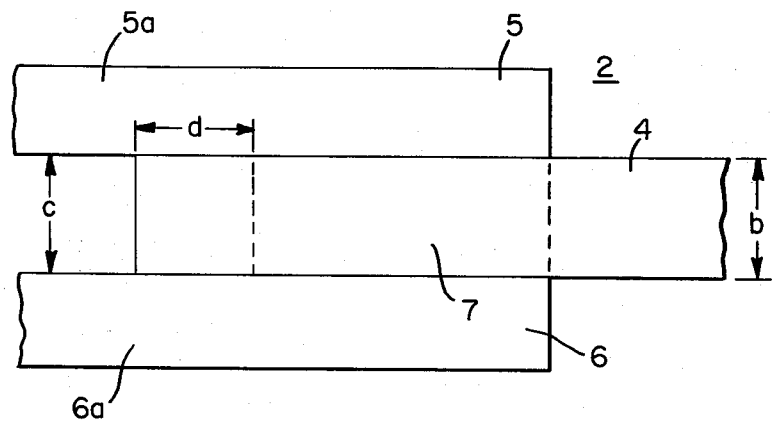
FIG. 3 is a plan view of an IGFET in an integrated circuit in accordance with the present invention.

Referring to FIG. 3, a plan view is shown of an IGFET utilized in an integrated circuit in accordance with the present invention. Like elements in FIGS. 1 and 3 have the same numerical designations.

Figure 1:
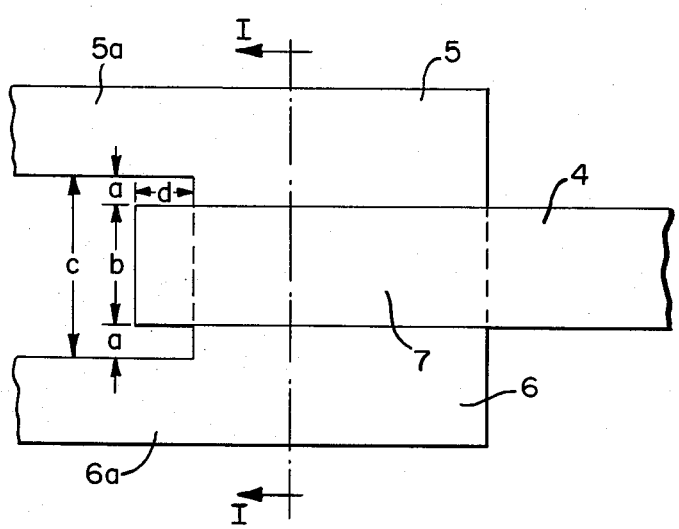
FIG. 1 is a plan view of a conventional IGFET in an integrated circuit.
Figure 2:
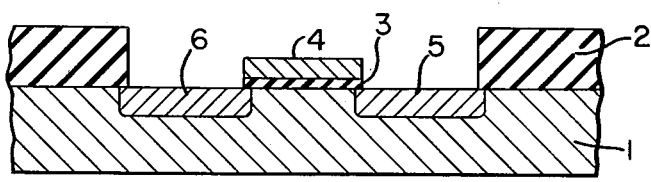
FIG. 2 is a cross section of the IGFET shown in FIG. 1.

A piece of silicon is prepared for use as a semiconductor substrate. The top surface of the substrate is covered with a relatively thick oxide field layer 2. The field layer 2 contains apertures to expose the surface of the substrate at its active regions including the surface area of a source region 5, an extended source region 5a, a drain region 6, an extended drain region 6a and a channel region 7. The exposed silicon surface of the substrate is then oxidized to form a gate insulator. A silicon gate 4 is then formed on the surface of the field oxide layer 2 and over the channel region 7. The gate width "b" is selected to be equal to the spacing "c" between the extended source and drain regions 5a and 6a so as to eliminate the spacing "a" as shown in FIG. 1. The gate 4 is closely aligned between the source and drain regions 5 and 6. Note that the gate 4 is extended beyond the side of the channel region 7 by the distance "d" which, in accordance with the present invention, is made equal to or greater than the spacing "c".

A diffusion process is performed to form the regions 5, 5a, 6 and 6a using the gate 4 as a mask. The diffusion process causes the gate 4 to be conductive.

The IGFET thus formed in accordance with the present invention has a predetermined breakdown voltage which is mainly dependant upon the spacing "c".

The IGFET shown in FIG. 3 is an example of an ideal model having no alignment error in the vertical direction.

Figure 4:
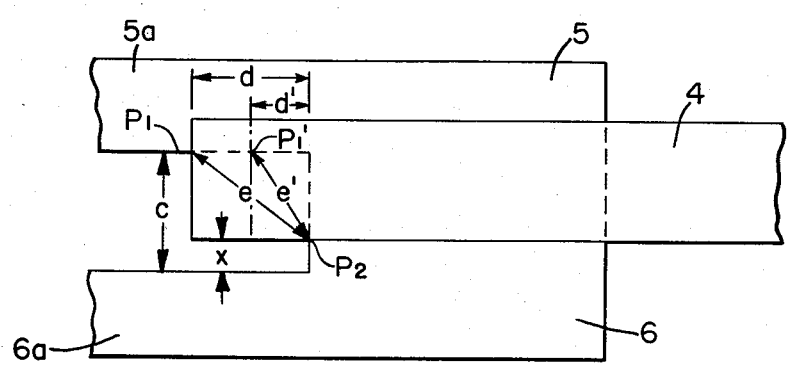
FIG. 4 is a plan view of another IGFET in an integrated circuit in accordance with the present invention.

FIG. 4 shows a further example of an embodiment of the invention. The IGFET shown in FIG. 4 is illustrated as having a vertical alignment error. The gate 4 is shifted up slightly so that the surface area of the source region 5 has its area decreased by the displacement area of the gate 4 such that when the IGFET was fabricated according to the self-alignment process described above, the predetermined channel area was formed without decreasing the breakdown voltage between the source and drain regions 5 and 6. The distance "d" of the extended gate end portion is selected so that the length "e" of a diagonal line originating at the cross point P₁ of the gate 4 and the source region 5 and ending at the cross point P₂ of the gate 4 and the drain region 6 is equal to or greater than the gate width "b". If the gate 4 had an extended gate end portion having a distance "d'", the diagonal line between the cross points P₁' and P₂, having the length "e'", becomes less than the gate width "b" thereby decreasing the breakdown voltage.

More specifically, the diagonal length "e" of the present invention is expressed as follows, $$e = \sqrt{(b-x)^2 + d^2} \geq b$$

wherein the "x" represents the above mentioned displacement of the gate 4. For example, if the gate width "b" and spacing "c" were equal to 8 μm and the displacement "x" was less than 2 μm over all of the substrate surface, then the extension "d" in accordance with the present invention must be greater than approximately 8 μm.

According to the present invention, a small sized IGFET may be fabricated without the spacing "a" shown in FIG. 1, whereby the total surface area of the IGFET is greatly decreased. Furthermore, it is possible to fabricate small sized IGFETs having predetermind breakdown voltages, for use in integrated circuits, even though alignment errors may occur in the process of placing the gate electrodes on the respective gate insulators of the IGFETs.

Figure 5:
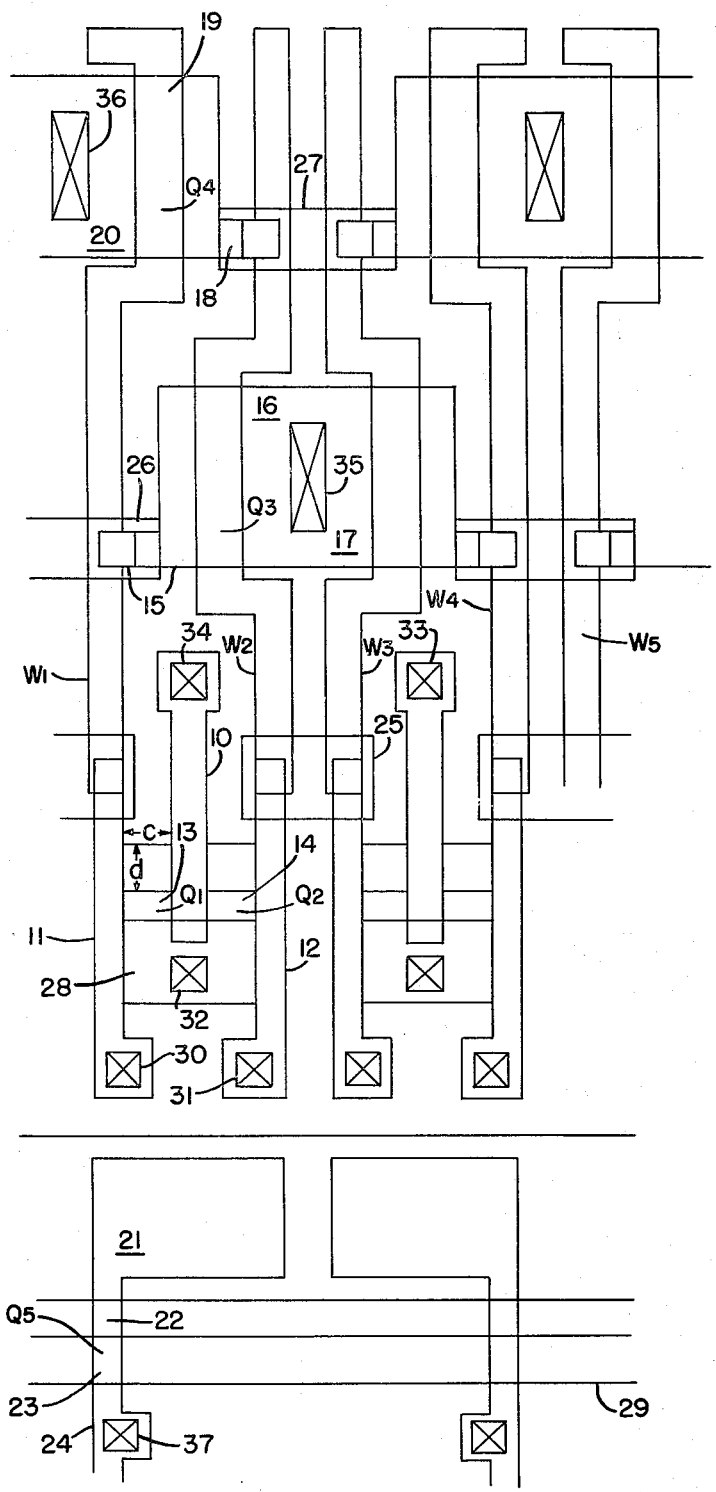
FIG. 5 is a partial plan view of a one transistor cell MOS memory circuit in accordance with the present invention.

FIG. 5 in a partial plan view of a one transistor cell MOS memory circuit according to the further embodiment of the present invention. The memory circuit is manufactured as follows:

A silicon substrate is prepared having a P-type conductivity and a specific resistivity of about 10 Ω·cm. An initial oxidation step is performed to form a 0.5μ thick silicon dioxide surface layer on the silicon substrate. The surface area of the silicon substrate is then exposed to a channel stop diffusion process except for the areas in which active memory circuit regions are to be located. The channel stop diffusion process is performed by depositing the required impurity material on the exposed silicon substrate surface area and diffusing the impurity into the substrate. This process is well known in the art. The surface sheet resistivity of the channel stop diffusion process may be controlled to be on the order of 7000Ω per square. The substrate is then prepared so as to again expose its surface to a subsequent diffusion at the areas of its source regions, drain regions, and channel regions. The exposed silicon surface is then oxidized to enable the growing of a gate insulator of silicon dioxide having a thickness of about 0.1μ.

A common drain region 10 runs parallel to the source regions 11 and 12 and is 6μ wide and 45μ long. The channel regions 13 and 14 are for the MOS transistors, Q₁ and Q₂ and have a channel width of 5μ and a channel length of 8μ. The source regions 11 and 12 are 5μ wide and 57μ long. The drain region 15, the channel region 16 and the common source region 17 are then covered with the gate insulator. The channel region 16 is for the MOS transistor Q₃. The drain region, the channel region 19 and the common source region 20 are also then covered with the gate insulator.

With regard to the resulting memory cell, the surface of storage capacitor 21, source region 22, channel region 23, and common drain region 24 are also covered with the gate insulator; the gate insulator is also used as the dielectric for capacitor 21.

The remaining surface area of the substrate, (other than the regions described above), is covered with a relatively thick oxide layer of about 0.6μ.

The next step is to align the common windows 25, 26 and 27 and to etch away the insulator on the source regions and drain regions in the windows. It is noted that only the surface areas of the sources and drain regions in the windows are exposed. The other surface areas remain unexposed due to the thickness of the field oxide layer.

The above step is followed by the step of depositing a polycrystalline silicon layer on the entire surface of the substrate using a standard chemical vapor deposition furnace into which monosilane gas is introduced for pyrolysis. It is known that the uniformity of the deposited silicon layer is increased by decreasing the pressure in the furnace during the pyrolysis. The deposited silicon layer formed has a thickness of 0.5μ.

The silicon layer is then etched using conventional photolithography techniques to produce the pattern shown in FIG. 5.

In FIG. 5 the common gate region 28 is provided for both the transistors Q₁ and Q₂. The extension "d" is selected to be 8μ long in accordance with the present invention. The spacing "c" between the drain region 10 and the source region 11 must be considered in the selection. The selection of the particular value for "d" has been previously described with regard to the explanation of FIG. 4.

The polycrystalline silicon wiring interconnections W₁ to W₅ are also formed after the photolithographic process. One end of the wiring interconnection W₁ is in contact with the end of the source region 11. The wiring interconnection W₁ is also in contact with the end portion of the drain region 15. The other end of the wiring interconnection $W_1$ is placed over the channel region 19 to form the gate of the transistor $Q_4$.

One end of the wiring interconnection $W_2$ is in contact with the end of the source region 12. The wiring interconnection $W_2$ runs over the channel region 16 of the transistor $Q_3$ and terminates in contact with the end of the drain region 18. The wiring interconnections $W_3$ to $W_5$ are formed in a fashion similar to the wiring interconnections $W_1$ and $W_2$.

The electrical contact between the source or drain and the silicon wiring is well illustrated in previously cited U.S. Pat. No. 3,699,646.

Figure 6:
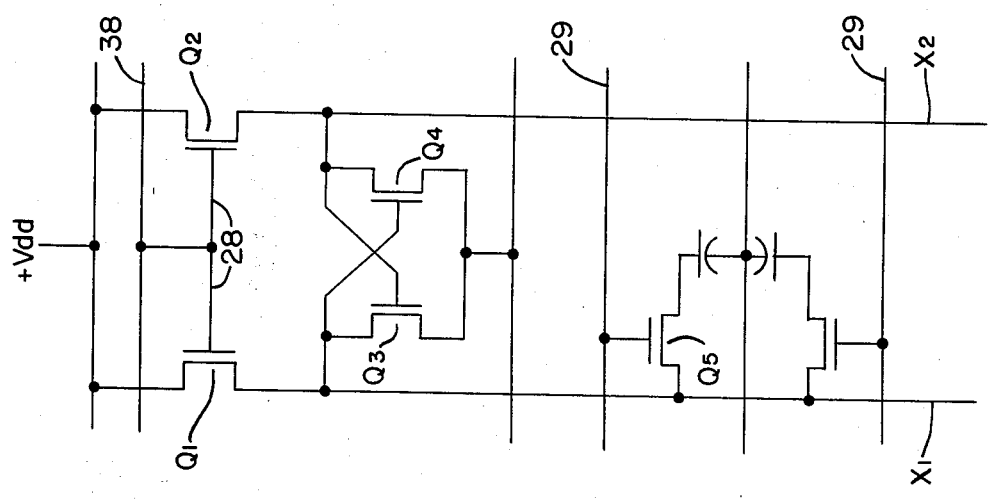
FIG. 6 is an equivalent circuit diagram of one column of the one transistor cell MOS memory circuit shown in FIG. 5.

The silicon wiring interconnection 29 crosses over the channel region 23 of the transistor $Q_5$. It is noted that silicon wiring interconnection 29 is located at each row of the memory cell. This is illustrated in FIG. 6.

After the photolithographic process, the substrate is placed in an etching solution to etch away the remaining silicon dioxide which had been formed over all the source and drain regions. The etching time is controlled so that the remaining silicon dioxide is completely removed.

The substrate is then ready for a diffusion step in which an N-type impurity is first deposited and then diffused into the substrate to form source and drain regions having a predetermined depth.

The substrate is then placed in a chemical vapor deposition apparatus into which a reaction gas comprising monosilane, oxygen and phosphine has been introduced, to form the insulating layer. The insulating layer thus formed is mainly composed of silicon dioxide and phosphorus oxide, which is otherwise called PSG (Phospho-Silicate Glass).

After covering the entire surface of the substrate with the PSG, a photolithographic process is then performed to form the windows 30 to 36. An aluminum layer is then evaporated on the entire surface of the substrate. The aluminum layer is then etched to leave the required metal wiring interconnections.

The wiring interconnections include a pair of bit line $X_1$ and $X_2$ which start from the contact windows 30 and 31 as illustrated at the bottom of FIG. 6. The bit line $X_1$ is laid on top of the window 37 in each row.

An internal signal line, (not shown in FIG. 5), is placed horizontally over the common gate regions 28 and is in contact with them through each window 32.

A power supply bus line is also placed horizontally and is in contact with the drain regions 10 through the windows 33 and 34.

A common source line is placed between the windows 35 and 36 and is in contact with the corresponding source regions 17 and 20 through the windows 35 and 36.

Another power supply bus line is placed upon the storage capacitor area and constitutes one electrode of the storage capacitor 21.

The entire surface of the substrate is then covered with PSG for surface protection and the required bonding pad area is exposed at each of electrode terminals.

FIG. 6 illustrates an equivalent circuit diagram of one column of the one transistor cell MOS memory circuit shown in FIG. 5. The circuit diagram of FIG. 6 will become apparent from the pattern arrangement of FIG. 5.

Transistors $Q_1$ and $Q_2$ have a common gate 28, driven by the signal voltage of the internal signal line 38. The source voltage on the internal signal line 38. The source 11 of transistor $Q_1$ is connected to the gate of transistor $Q_4$ through the wiring interconnection $W_1$. The source 11 of transistor $Q_1$ is connected to the gate of transistor $Q_4$ through the wiring interconnection $W_1$. The source 11 of transistor $Q_1$ is also connected to the bit line $X_1$ of this column. The source 12 of transistor $Q_2$ is connected to the gate of transistor $Q_3$ and is connected to the drain 18 of transistor $Q_4$ at the end of the wiring interconnection $W_2$. The source 12 is also connected to the bit line $X_2$ of this column.

The bit line $X_1$ is connected to all of the common drains 24 of this column.

Each row select line 29 is connected to the gate of transistor $Q_5$, respectively.

In the writing cycle of the memory, transistors $Q_1$ and $Q_2$ are made conductive, thereby equalizing the voltage level of the bit lines $X_1$ and $X_2$. The gate circuit connected to the bit line $X_1$ is opened to enable writing. The corresponding row select line connected to the required cell is then energized. As a result, transistor $Q_5$ is made conductive, thereby discharging any stored charge in the cell. For writing a low level or "0", the gate circuit for writing operates so that the bit line voltage remains at the low level. At the same time, the select line 29 is selected and the low level is stored in the cell. More specifically, the low level of the bit line $X_1$ results in generating a voltage difference between the semiconductor surface at the cell 21 and the power supply bus line placed over the cell and further results in the generating of an inversion layer at the surface; the inversion layer operating as a counter electrode of the capacitor.

In the read out cycle of the memory, the required column and row are selected; then the latch comprising transistors $Q_3$ and $Q_4$ are used for detecting the voltage difference between the bit lines $X_1$ and $X_2$ and for sustaining the bit line voltage in accordance with the condition of the memory cell.

It is noted that the column width is an important factor with respect to the chip size of the memory circuit because of the fact that a plurality of the columns shown in FIG. 6 are normally adjacently arranged. The circuit configuration according to the present invention, as shown in FIG. 5, has a higher density than a circuit configuration of conventional design. The higher density results in a smaller total chip area.

Figure 7:
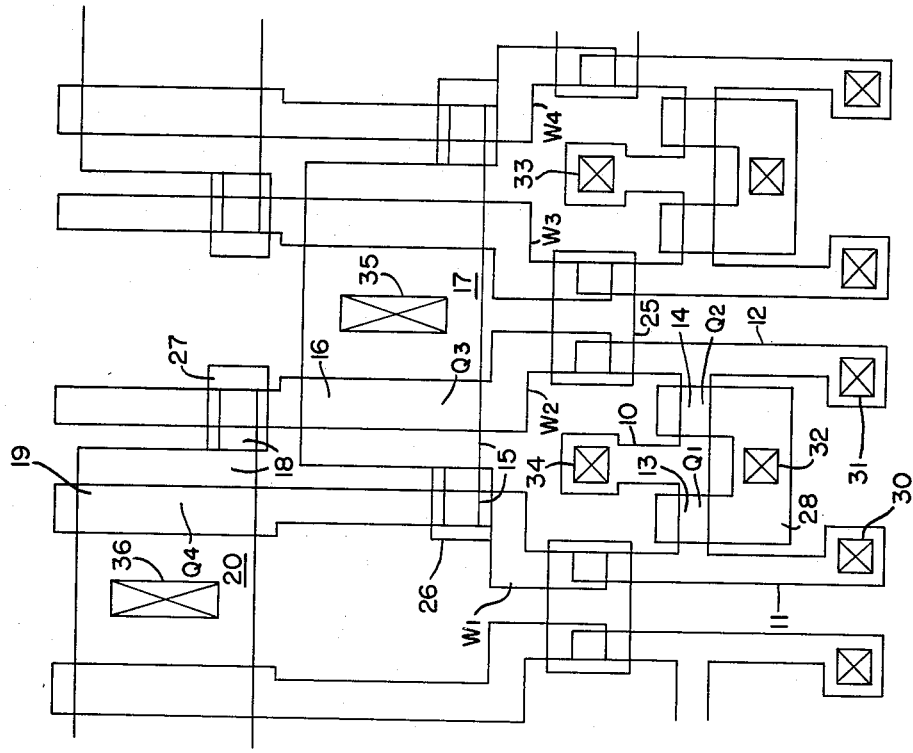
FIG. 7 is a plan view of the corresponding circuit of conventional design of the circuit of FIG. 5.

FIG. 7 is a plan view of a circuit configuration of conventional design corresponding to the circuit of FIG. 5. Like elements in FIGS. 5 and 7 have the same numerical designations. According to the circuit configuration of conventional design, the length of the extension of the gate region 28 is $4\mu$ and a spacing of $2\mu$ is left between the gate region 28 and source regions 11 and 12. The conventional design requires an additional $8\mu$ in the row direction for each column so that an additional $512\mu$, (0.512 mm), is required for fabricating 64 columns of a 4096 bit memory. In other words, the utilization of the circuit configuration in accordance with the present invention, as shown in FIG. 5, enables a decreased length of 0.512 mm in the row direction for a 4096 bit memory as compared with the conventional circuit configuration design of FIG. 7. Accordingly, the total chip area of the 4096 bit memory is reduced considerably.

While various specific embodiments and examples of the invention have been described in detail above, it will be obvious that various modifications may be made from the specific details described, without departing from the spirit and scope of the invention. For example, an ion implantation method can be used for inducing impurities into the semiconductor substrate instead of the diffusion method described above.

What is claimed is:

1. An insulated gate field effect transistor comprising:
   a semiconductor substrate;
   a source region formed in said semiconductor substrate;
   a drain region and a channel region formed in said semiconductor substrate, said drain region located opposite to said source region, and said channel region located therebetween, whereby said source and drain regions define the channel width of the channel region of said field effect transistor; and
   a gate electrode having a first portion formed on top of a first insulating layer formed on top of said semiconductor substrate between said souce and drain regions, said first portion of said gate electrode defining the channel length of the channel region of said field effect transistor, and said gate electrode having an extended end portion formed on top of a second insulating layer, the length of said extended end portion is selected whereby the length of a diagonal line, beginning at the intersection of the end of the extended end portion of said gate electrode and said source region and ending at the intersection of said gate electrode and the end of said drain region, is not less than the width of said gate electrode.

2. An insulated gate field effect transistor as recited in claim 1, wherein said length of said extended end portion is equal to the width of said gate electrode.

3. An insulated gate field effect transistor as recited in claim 1, wherein said length of said extended end portion is greater than the width of said gate electrode.

4. An insulated gated field effect transistor as recited in claim 1, wherein said gate electrode is comprised of polycrystalline silicon.

5. An insulated gate field effect transistor comprising:
   a semiconductor substrate;
   a source region formed in said semiconductor substrate, said source region being extended in a first direction and having a substantially rectangular surface area;
   a drain region and a channel region formed in said semiconductor substrate, said drain region being extended in said first direction to define a region having a substantially rectangular surface area, said extended drain region being parallel to said extended source region and said drain region located opposite to said source region and said channel region located therebetween, whereby said source and drain regions define the channel width of the channel region of said field effect transistor;
   a gate insulator formed on the surface of the channel region of said field effect transistor;
   a field insulator formed on the surface of said semiconductor substrate, said insulator having apertures located at said channel region and said source and drain regions;
   a gate electrode formed on the surface of both said gate insulator and said field insulator, said gate electrode being extended in a second direction for providing an electrical connection and further being extended on said field insulator in said first direction between said extended source and drain regions, said gate electrode having a width equal to the spacing between said source and drain regions, said gate electrode being closely positioned between said source region and drain region, wherein the length of said extended gate electrode in said first direction is not less than the spacing between said source and drain regions.

6. An insulated gate field effect transistor as recited in claim 5, wherein at least one of said source and drain regions is extended in said second direction.

7. An insulated gate field effect transistor comprising:
   a semiconductor substrate;
   a source region, a drain region, and a channel region, each formed in said substrate and having a rectangular surface area; said channel region located between said source and drain regions; said source and drain regions extended in a first direction;
   a gate electrode having a first portion formed on top of a first insulating layer formed on top of said semiconductor substrate between said source and drain regions; said gate electrode having a rectangular surface area and further having an extended end portion formed on top of a second insulating layer in said first direction; the length of said extended end portion of said gate electrode is selected such that the length of a diagonal line beginning at the intersection of the end of the extended end portion of said gate electrode and said source region and ending at the intersection of said gate electrode and the end of said drain region located adjacent to the extended portion of said drain region, is not less than the width of said gate electrode.

8. A method of fabricating an insulated gate field effect transistor comprising the steps of:
   providing a semiconductor substrate for the transistor;
   forming a source region, a drain region, and a channel region in the substrate, each region having a rectangular surface area;
   forming the channel region between the source and drain regions;
   extending the source and drain regions in a first direction;
   forming a gate electrode having a first portion on top of a first insulating layer formed on top of the semiconductor substrate between the source and drain regions; the gate electrode having a rectangular surface area and further having an extended end portion formed on top of a second insulating layer in the first direction, the length of the extended end portion of the gate electrode is selected such that the length of a diagonal line beginning at the intersection of the end of the extended end portion of the gate electrode and the source region and ending at the intersection of the gate electrode and the end of the drain region located adjacent to the extended portion of the drain region, is not less than the width of the gate electrode.

* * * * *

UNITED STATES PATENT AND TRADEMARK OFFICE
CERTIFICATE OF CORRECTION

PATENT NO. : 4,224,633
DATED : SEPTEMBER 23, 1980
INVENTOR(S) : JUN-ICHI MOGI ET AL.

It is certified that error appears in the above—identified patent and that said Letters Patent is hereby corrected as shown below:

Column 3, line 42, after "follows", "," should be --:--;

Column 3, line 43, "$e = \sqrt{(b-x)^2 + d^2} \geq b$" should be --$e = \sqrt{(b-x)^2 + d^2} \geq b$--;

Column 3, line 61, "in" should be --is--.

Signed and Sealed this

Twenty-sixth Day of October 1982

[SEAL]

Attest:

Attesting Officer

GERALD J. MOSSINGHOFF

Commissioner of Patents and Trademarks